United States Patent [19]

Hikawa et al.

[11] Patent Number: 4,628,282
[45] Date of Patent: Dec. 9, 1986

[54] CLOCK GENERATOR FOR DIGITAL DEMODULATORS

[75] Inventors: Kazuo Hikawa, Tokyo; Kazuya Toyomaki, Zama; Hiroyuki Yamazaki, Yokohama, all of Japan

[73] Assignee: Victor Company of Japan, Ltd., Yokohama, Japan

[21] Appl. No.: 717,094

[22] Filed: Mar. 28, 1985

[30] Foreign Application Priority Data

Mar. 30, 1984 [JP] Japan .................... 59-62849

[51] Int. Cl.$^4$ .............................................. H03L 7/00
[52] U.S. Cl. ...................................... 331/1 A; 331/11; 331/25; 307/526; 328/133
[58] Field of Search ............... 331/1 A, 11, 23, 25, 331/27; 307/511, 526; 328/133, 155; 375/120

[56] References Cited

U.S. PATENT DOCUMENTS

| | | | |
|---|---|---|---|
| 3,796,962 | 3/1974 | Hekimian | 328/133 |
| 4,276,512 | 6/1981 | Wittke | 328/133 |
| 4,320,527 | 3/1982 | Takasaki | 375/119 |
| 4,375,693 | 3/1983 | Kuhn | 375/120 |
| 4,514,705 | 4/1985 | Harzer | 331/11 X |

FOREIGN PATENT DOCUMENTS

| | | |
|---|---|---|
| 0091200 | 10/1983 | European Pat. Off. |
| 1049856 | 11/1966 | United Kingdom |
| 1413608 | 11/1975 | United Kingdom |

OTHER PUBLICATIONS

IBM Technical Disclosure Bulletin, vol. 27, No. 1A, Jun. 1984, pp. 355-357: "Variable Frequency Oscillator Using a Frequency Discriminator", by Rae and Swart.

Primary Examiner—Eugene R. LaRoche
Assistant Examiner—Robert J. Pascal
Attorney, Agent, or Firm—Cushman, Darby & Cushman

[57] ABSTRACT

A clock generator for digital demodulators is disclosed wherein a voltage-controlled oscillator (19) generates clock pulses at controlled frequency and phase in response to error signals from a phase comparator (14) and a frequency comparator (12). The phase error signal represents a phase deviation of the clock from a window pulse which is generated in response to a predetermined transition between binary "1"s and binary "0"s of an input bit stream. The frequency comparator detects the frequency of the clock pulse and compares it with lower and upper limits of a predetermined range of frequency variations and generates a frequency control signal having different voltages depending on the result of the comparison.

19 Claims, 8 Drawing Figures

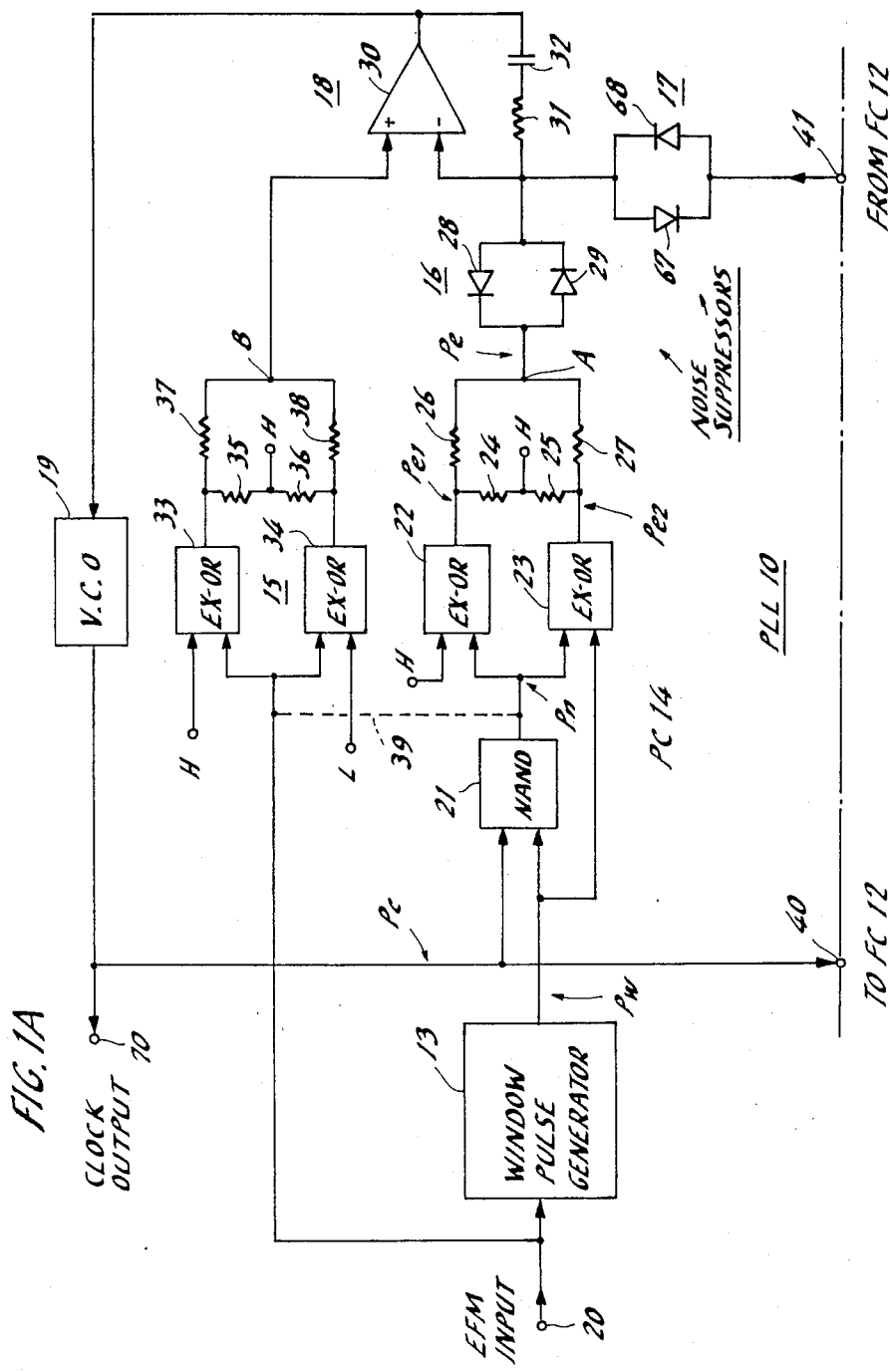

CLOCK GENERATOR FOR DIGITAL DEMODULATORS

BACKGROUND OF THE INVENTION

The present invention relates to clock generators, and more specifically, it relates to a clock generator for deriving clock information from a digital bit stream.

According to a digital modulation technique, such as eight-to-fourteen modulation (EFM), original eight bit codes of random clock spacings are converted to fourteen bit codes of the format having a minimum spacing of three clock pulses and a maximum spacing of eleven clock pulses to provide enough clock information to demodulate the EFM bit stream.

Conventional clock generators employed for demodulating such EFM bit streams include circuitry that detects a series of data bits having the minimum and maximum clock spacings and counts clock pulses generated by a voltage-controlled oscillator which are present during the minimum and maximum spacings of the detected data bits. Two count values are derived as a measure of the frequency of the clock pulse to control the frequency of the oscillator. One disadvantage of the prior art is that since the data bits of minimum and maximum clock spacings occur at random the phase-locked loop is likely to remain out-of-phase with the input bit stream for a substantial period if successive frames contain no data bits having mininum and maximum clock spacings.

SUMMARY OF THE INVENTION

It is therefore an object of the present invention to provide a clock generator which is simple in circuit design and stable in clock frequency.

This object is obtained by deriving a frequency control signal from the lower and upper limits of a predetermined range of variations allowed for clock frequency.

The clock generator of the invention comprises a voltage-controlled oscillator for generating clock pulses, means for generating a window pulse in response to a predetermined transition between binary "1"s and binary "0"s in the bit stream, a phase comparator responsive to the window and clock pulses for generating a phase control signal representing the difference in phase between the window pulse and the clock pulse, and a frequency comparator. The frequency comparator detects the frequency of clock pulse and compares it with lower and upper limits of a predetermined range of frequency variations and generates a frequency control signal of different levels according to the result of the comparison. The phase and frequency control signals are combined and applied to the voltage-controlled oscillator to control the phase and frequency of the clock pulses.

The comparison with the clock frequency with the reference values allows the clock generator to quickly return to phase-locked state as soon as the clock frequency goes beyond the predetermined range.

BRIEF DESCRIPTION OF THE DRAWINGS

The present invention will be described in further detail with reference to the accompanying drawings, in which:

FIG. 1A is a block diagram of a phase-locked loop of the invention;

DETAILED DESCRIPTION

Figure 1B:
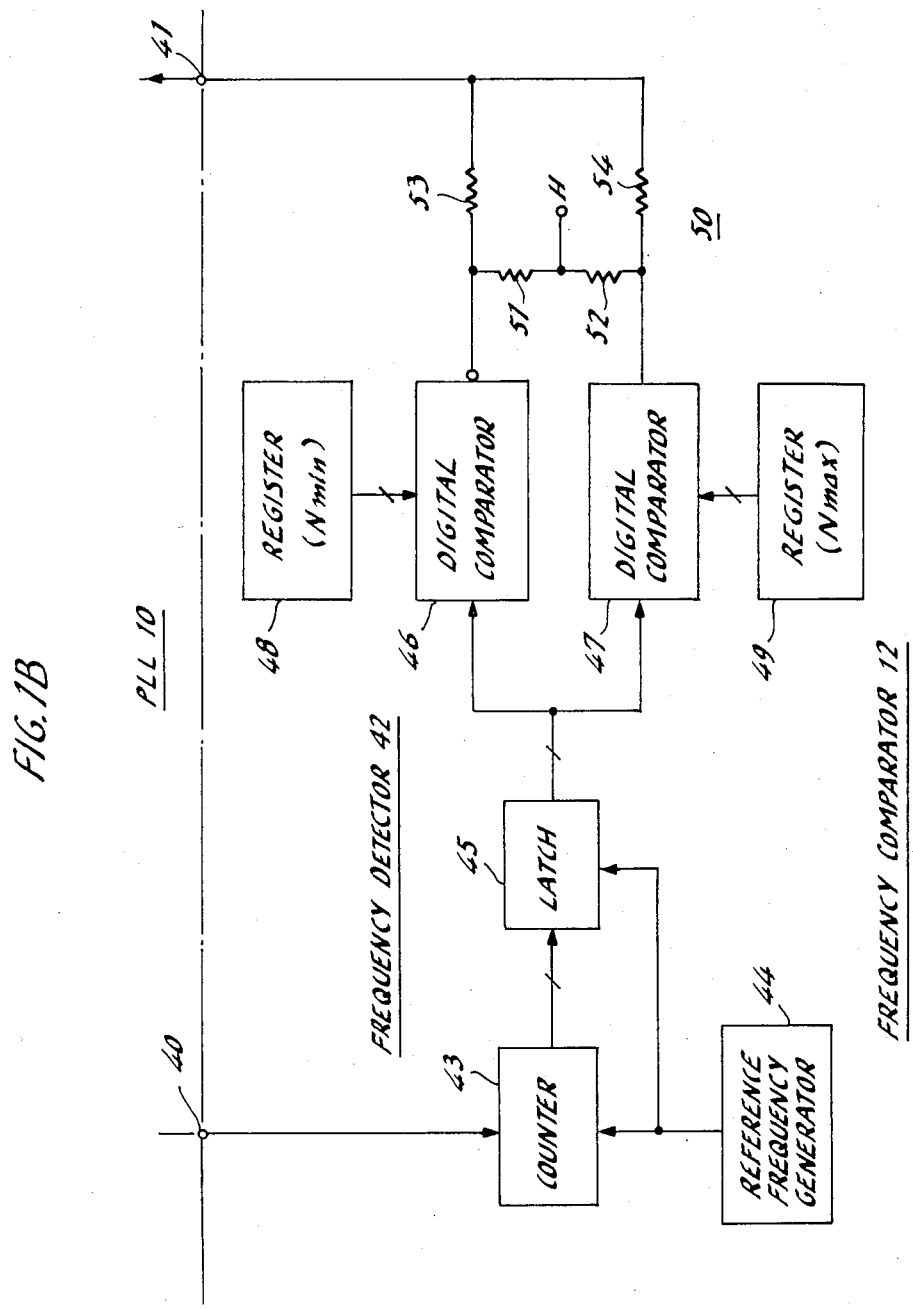
FIG. 1B is a block diagram of a frequency comparator constructed according to the invention.

In FIGS. 1A and 2B, there is shown a preferred embodiment of the clock generator of the present invention. The clock generator comprises a phase-locked loop 10 shown in FIG. 1A and a frequency comparator 12 shown separately in FIG. 1B. The phase-locked loop 10 includes a window pulse generator 13, a phase comparator 14, a reference circuit 15, noise suppressors 16, 17, a differential integrator 18 and a voltage controlled oscillator 19. Window pulse generator 13 is connected to an input terminal 20 to which a digitally modulated bit stream is applied.

According to one digital modulation technique, original 16 bit code is divided into upper and lower binary significant groups of eight bits each and each group is converted to a 14-bit code in which binary "1"s occur at calculated maximum intervals to make it less likely to lose clock timing on playback. The EFM modulated bit stream is formatted into a series of data blocks, or frames of 588 bits, each identified by a 24-bit frame sync code which is followed by a data bit stream in which binary "1"s occur at a minimum spacing of 3 clock intervals and at a maximum spacing of 11 clock intervals. Binary "1"s and binary "0"s in the input bit stream present high and low voltages, respectively, at the input terminal 20.

Figure 2:
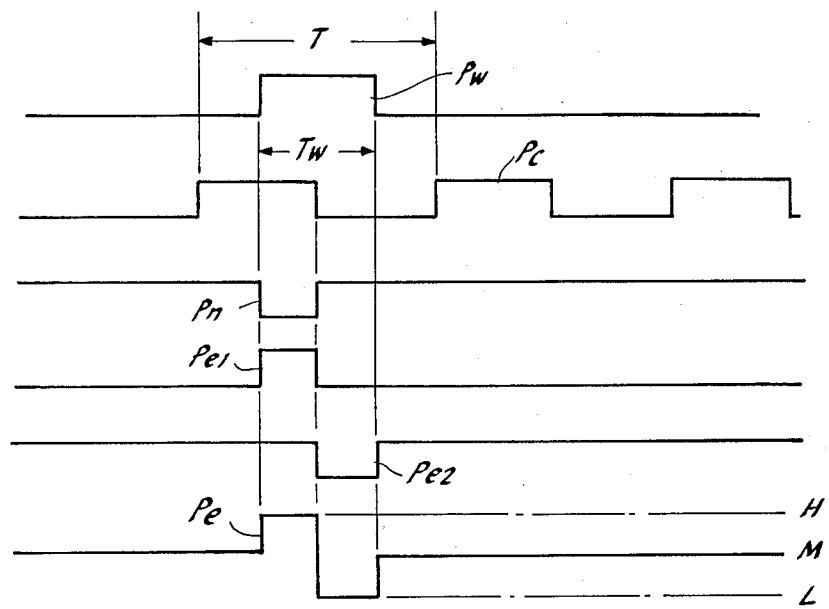
FIG. 2 is a waveform diagram useful for describing the operation of the phase-locked loop.

The window pulse generator 13 is responsive to the transition of binary level that occurs at the rising edge and/or falling edge of the positive-going pulses of the input bit stream and generates a window pulse Pw of a duration Tw smaller than the pulse spacing T of clock pulses Pc generated by the voltage controlled oscillator 19. The waveforms of these pulses are shown at FIG. 2. Preferably, the window and clock pulses have equal pulse duration.

The phase comparator 14 comprises a NAND gate 21, Exclusive-OR gates 22 and 23, and a resistor network formed by a first series of resistors 24, 25 and a second series of resistors 26, 27 both connected across the outputs of Exclusive-OR gates 22 and 23. One input of each Exclusive-OR gate is connected to the output of NAND gate 21 and the other input of Exclusive-OR gate 22 is connected to logical high level source. The other input of gate 23 is connected to the output of window pulse generator 13. A junction between resistors 24 and 25 is connected to a voltage source having a logical high level corresponding to binary "1" and a junction A between resistors 26 and 27 is connected through noise suppressor 16 to the inverting input of an operational amplifier 30. Resistors 26 and 27 form an analog adder circuit by which the voltages at the outputs of Exclusive-OR gates 22 and 23 are arithmetically summed at junction A. Resistors 24, 25, 26 and 27 are selected so that the junction A is normally maintained at a medium potential M at which clock pulses Pc and window pulses Pw are in exact phase.

Window pulses are supplied to one input of NAND gate 21 to be compared in phase with clock pulses from the oscillator 19. The phase difference between these pulses results in the generation of a negative-going pulse Pn whose leading edge is coincident with the leading edge of window pulse Pw and whose trailing edge is coincident with the trailing edge of clock pulse Pc, as shown in FIG. 2.

Exclusive-OR gate 22 provides a first, positive-going phase error pulse $Pe_1$ which is reverse in polarity to the input pulse Pn. Exclusive-OR gate 23 provides a second, negative-going phase error pulse $Pe_2$ whose leading edge is coincident with the trailing edge of clock pulse Pc and whose trailing edge is coincident with the trailing edge of window pulse Pw. The durations of phase error pulses $Pe_1$ and $Pe_2$ thus vary complementarily with each other according to the amount of phase difference between pulses Pw and Pc. The positive-going pulse $Pe_1$ and negative-going pulse $Pe_2$ are combined at junction A so that the potential thereat is driven to a high voltage level H in the presence of the pulse $Pe_1$ and driven to a lower voltage level L in the presence of the pulse $Pe_2$ for complementary periods of time as shown at Pe in FIG. 2 on detection of a phase difference.

Noise suppressor 16 is formed by a pair of antiparallel-connected diodes 28 and 29. The phase error voltage having amplitudes greater than the thresholds of diodes 28 and 29 are passed to the inverting input of operational amplifier 30. Small amplitude noise components which might be present in the phase error voltage at junction A are therefore blocked.

A series circuit of integrating resistor 31 and capacitor 32 is connected between the output of amplifier 30 and the inverting input thereof to permit operational amplifier 30 to provide detection of a difference potential between the voltage applied to the inverting input and a reference voltage applied to its noninverting input and provide integration of the difference potential. Operational amplifier 30 drives the oscillator 19 to control its frequency and phase to maintain clock and window pulses in proper phase relationship.

The loop gain of the phase-locked loop 10 is determined by the reference voltage developed by reference circuit 15. This circuit comprises a pair of Exclusive-OR gates 33 and 34 and a resistor network formed by a first series of resistors 35 and 36 and a second series of resistors 37 and 38, both being connected across the outputs of Exclusive-OR gates 33 and 34. First input terminals of Exclusive-OR gates 33 and 34 are coupled together to the input terminal 20 and their second inputs are connected respectively to high and low level voltages corresponding to binary "1" and "0", respectively. A junction between resistors 35 and 36 is connected to a high-level voltage source and a junction B between resistors 37 and 38 is connected to the noninverting input of operational amplifier 30. Resistors 37 and 38 combine to form an adder circuit with which the output of Exclusive-OR gates 33 and 34 are arithmetically summed at junction B. Exclusive-OR gate 33 has the effect of generating a series of pulses having an opposite polarity to those applied to the input terminal 20 and Exclusive-OR gate 34 has the effect of generating a series of pulses which is the replica of the input EFM bit stream. Therefore, the output pulses from Exclusive-OR gates 33 and 34 are opposite in polarity to each other and canceled at junction B. Resistors 35, 36, 37 and 38 determine the reference voltage at junction B and hence the loop gain. The application of EFM input bit stream to Exclusive-OR gates 33 and 34 causes the reference voltage to vary simultaneously with the occurrence of a phase error voltage. This improves the transient response of the phase-locked loop. The input signal to Exclusive-OR gates 33 and 34 may alternatively be taken from the output of NAND gate 21 as indicated by a broken-line 39. Since the reference circuit is indentical in configuration to a portion of the phase comparator 14, the reference voltage varies with the output of phase comparator 14 under varying temperature and humidity conditions.

In this way, the voltage-controlled oscillator 19 is controlled by the time-integral value of the difference between voltage inputs to operational amplifier 30. The output of voltage controlled oscillator 19 is connected to an output terminal 70 from which clock pulses are supplied to a utilization circuit, not shown.

When the clock pulse deviates from normal frequency, the phase-locked loop 10 receives a frequency control signal from the frequency comparator 12 through terminal 41.

Referring to FIG. 1B, frequency comparator 12 includes a frequency detector 42 which comprises a counter 43, a reference frequency generator 44 and a latch 45. Counter 43 is responsive to clock pulses supplied through terminal 40 from the voltage-controlled oscillator 19. Reference frequency generator 44 provides resetting pulses at a constant reference frequency to the counter 43 and latch 45. The reference frequency is lower than the clock frequency to allow the counter to count clock pulses present during the period of the reference frequency pulses. The clock count in counter 43 representing the clock frequency is transferred to latch 45 in response to each reset pulse. The latched count is read out by digital comparators 46 and 47 for comparison with minimum value Nmin and maximum value Nmax of frequency deviation stored in registers 48 and 49, respectively. These minimum and maximum values correspond respectively to the lower and upper allowable limits of the clock frequency. Comparator 46 generates a low voltage output when the count is equal to or higher than the lower limit Nmin and switches to a high output state when the count drops below the lower limit value. Comparator 47 generates a low voltage output when the count is equal to or lower than the upper limit Nmax and switches to a high output state when the count exceeds the upper limit value.

The outputs of comparators 46 and 47 are connected to a voltage dividing resistor network 50 formed by resistors 51 and 52 in series with a junction therebetween connected to a logical high voltage source H and resistors 53 and 54 in a series circuit in shunt with resistors 51 and 52. Resistors 53 and 54 combine the voltages developed by comparators 46 and 47 at terminal 41. It is seen that when the frequency count value is within the lower and upper limits, high and low voltages are developed by comparators 46 and 47, respectively, and combined to produce a frequency control signal having a medium voltage at terminal 41. This voltage is applied through noise suppressor 17 to the inverting input of operational amplifier 30 so that it drives the oscillator 19 at normal frequency. Noise suppressor 17 is formed by a pair of antiparallel-connected diodes 67 and 68 to suppress small-amplitude noise contained in the frequency control signal.

If the frequency count drops below the lower limit, low voltages are developed by both comparators and combined to produce a frequency control signal having a voltage lower than the medium, or neutral point. Conversely, if the frequency count exceeds the upper limit, both comparators generate high voltage outputs which are combined to produce a frequency control signal having a voltage higher than the neutral point.

The lower voltage at terminal 41 drives the oscillator 19 to raise the clock frequency and the higher voltage thereat lowers the clock frequency.

Figure 1C:
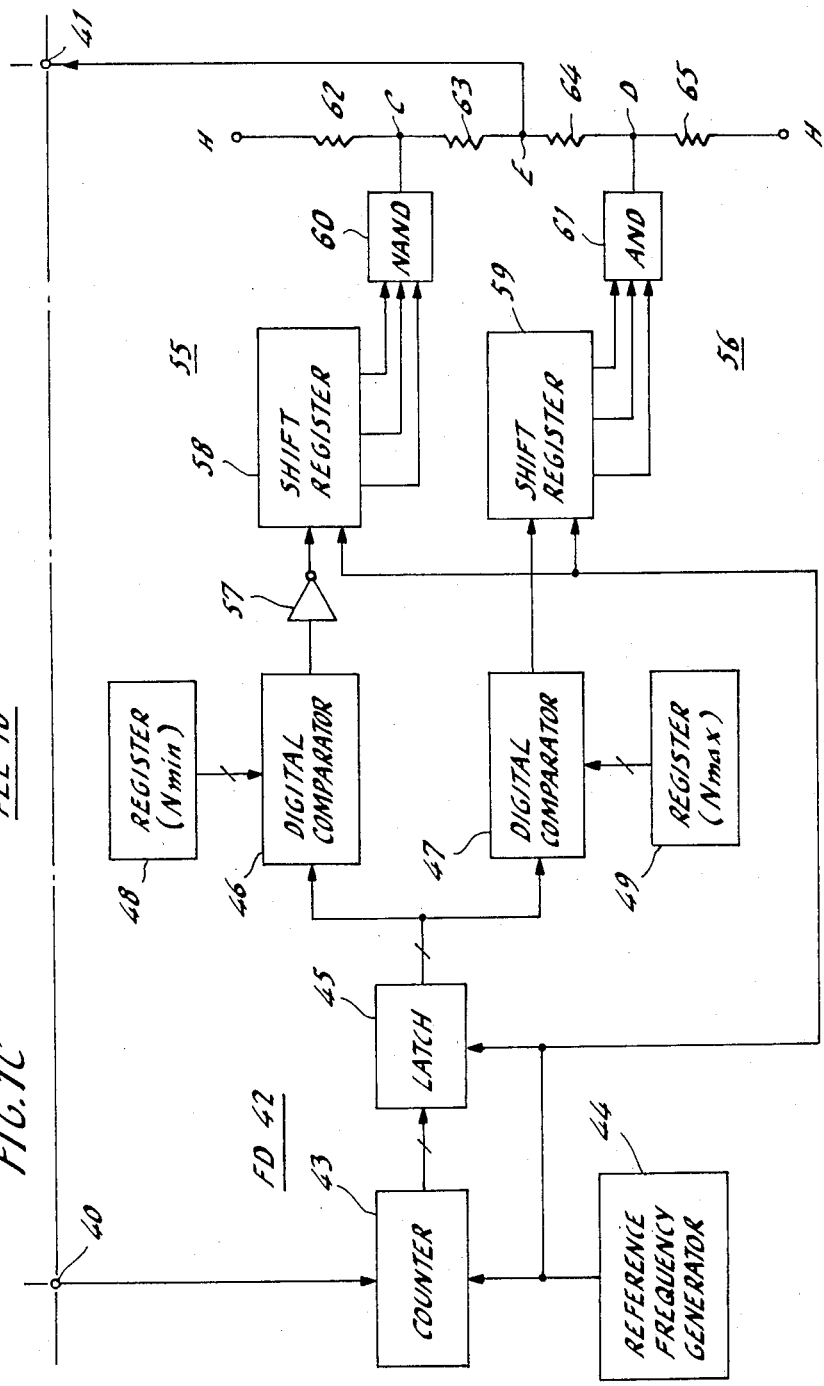
FIG. 1C is an illustration of a modified form of the frequency comparator.

It is preferable in some instances to introduce delays to the frequency control signal to stabilize the phase-locked loop against rapid fluctuations in frequency. A modification shown in FIG. 1C is provided for this purpose. In FIG. 1C parts corresponding to those in FIG. 1B are marked with the same numerals as used in FIG. 1B.

In this modification, the low-voltage output of digital comparator 46 is converted to a high voltage by an inverter 57 and applied to the data input of a three-stage shift register 58 and the high-voltage output of digital comparator 47 is directly applied to the data input of a three-stage shift register 59. The reference frequency pulse from the generator 44 is applied to shift registers 58 and 59 as a shift pulse to cause the voltage input to step along the register stages. The stages of shift register 58 are connected to a NAND gate 60 and those of shift register 59 to an AND gate 61. The output of NAND gate 60 is connected to a junction C between resistors 62 and 63 and the output of AND gate 61 is connected to a junction D between resistors 64 and 65 which are connected in series with resistors 62 and 63 between high voltage sources H. A junction E between resistors 63 and 64 is connected to the terminal 41.

When the clock frequency is normal, the output of NAND gate 60 is high and the output of AND gate 61 is low. High and low voltages at junctions C and D are combined to produce a medium-level voltage at junction E.

When the clock frequency becomes lower than the lower limit of the allowable range, the output of AND gate 61 is low and a high voltage input is loaded into shift register 58. If this condition exists until three shift pulses are applied to shift register 58, the output of NAND gate 60 switches to low level, driving the potential at junction C to low, and hence the potential at junction E to drop to a level lower than the medium level.

When the clock frequency becomes higher than the upper mit of the allowable range, the output of NAND gate 60 is high and a high voltage input is loaded into shift register 59. If this condition exists until three shift pulses are applied to shift register 59, the output of AND gate 61 switches to high level, driving the potential at junction D to high, and hence the potential at junction E to rise to a level higher than the medium level.

Figure 3:
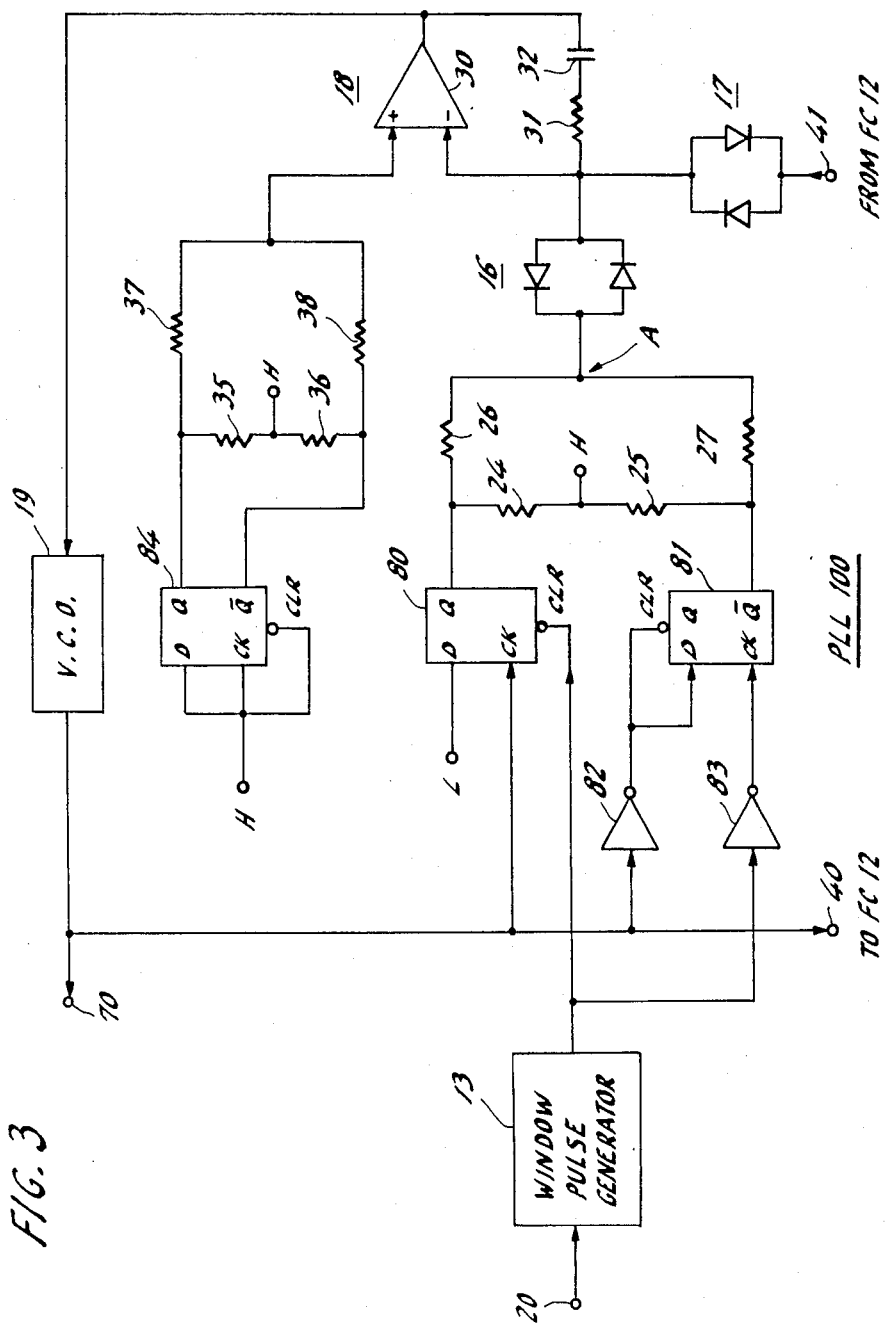
FIG. 3 is a block diagram of a modified phase-locked loop of the invention.

FIG. 3 is an illustration of an alternative embodiment of the phase-locked loop which is generally shown at numeral 100 and in which parts corresponding to those in FIG. 1A are marked with the same numerals as used in FIG. 1A. The phase-locked loop 100 differs from the phase-locked loop 10 in that D flip-flops 80, 81, 84 and inverters 82 and 83 replace the Exclusive-OR gates 22, 23, 33, 34 and NAND gate 21 of FIG. 1A. The output of window pulse generator 13 is applied to the clear input of flip-flop 80 and through inverter 83 to the clock input of flip-flop 81. Whereas, the output of voltage-controlled oscillator 19 is connected to the clock input of flip-flop 80 whose data input is impressed with a logical low voltage and through inverter 82 to the data and clear terminals of flip-flop 81. The true Q output of flip-flop 80 and the complementary Q output of flip-flop 81 are connected to the resistor network formed by resistors 24 to 27. Flip-flop 84 has its data, clock and clear input terminals coupled together to the logical low voltage source and its true and complementary Q outputs connected to resistors 35 to 38.

Figure 4A:
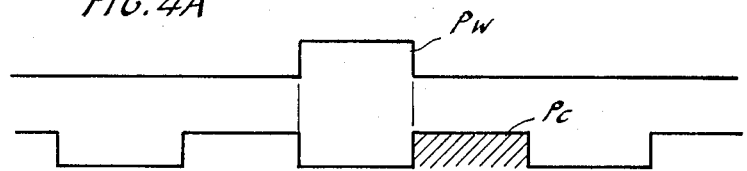
FIGS. 4A to 4C are waveform diagrams associated with the block diagram of FIG. 3.
Figure 4B:
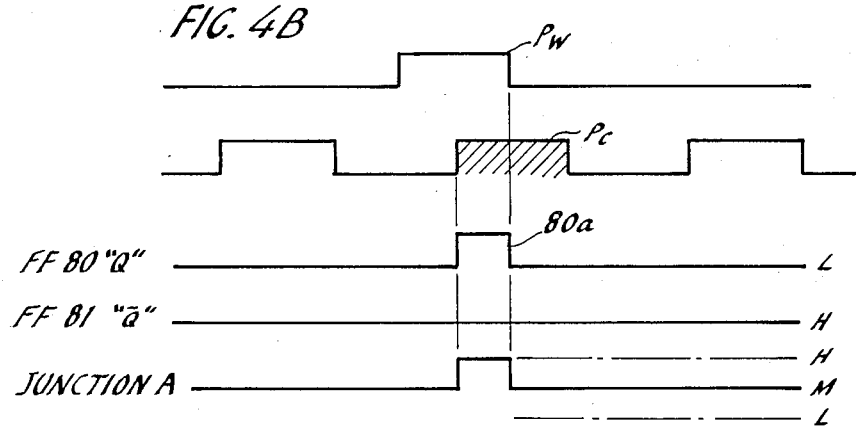
Figure 4C:
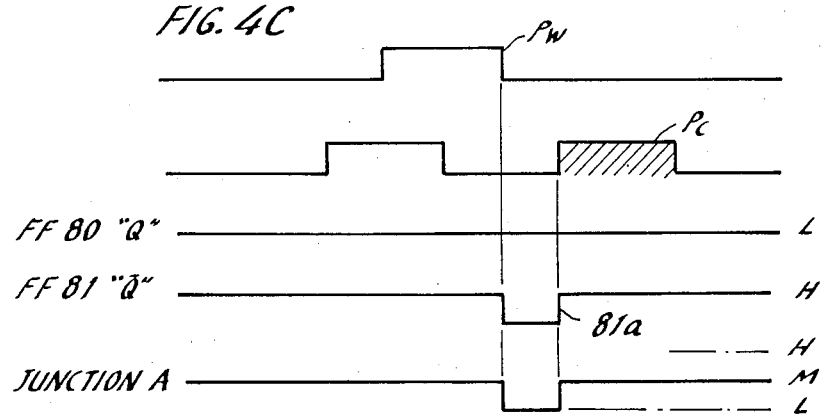

The operation of the phase-locked loop 100 is as follows. When clock pulses Pc are phase-locked with window pulses Pw as shown at FIG. 4A, the voltages at the outputs of flip-flops 80 and 81 are low and high, respectively, which are combined to produce a medium voltage M at junction A. When the clock pulse advances with respect to the window pulse, flip-flop 80 produces a positive-going pulse 80a (FIG. 4B) having a leading edge coincident with the leading edge of a clock pulse and a trailing edge coincident with the trailing edge of the window pulse, while the output of flip-flop 81 remains high. The positive-going pulse 80a is combined with the high voltage at the output of flip-flop 81 to cause the potential at junction A to rise to a level higher than medium level M during the period of pulse 80a to cause the oscillator 19 to lag the phase of the clock pulse in proportion to the amount of phase advance. If the clock pulse lags with respect to the window pulse, flip-flop 80 remains at low voltage state while flip-flop 81 generates a negative-going pulse 81a, as shown at FIG. 4C. This pulse has a leading edge coincident with the trailing edge of window pulse Pw and a trailing edge coincident with the leading edge of clock pulse Pc. The potential at junction A is reduced to a level lower than the medium level during the period of the pulse 81a to cause the oscillator 19 to advance the clock phase in proportion to the amount of phase lag.

The embodiments described above are particularly useful for adaptation to integrated circuits.

What is claimed is:

1. A clock generator adapted to receive a digital bit stream, comprising:
   a voltage-controlled oscillator for generating clock pulses having a frequency and a phase which are variable in response to an input signal applied thereto;
   means for generating a window pulse having a pulse duration smaller than the pulse spacing of said clock pulses in response to a predetermined transition between binary "1" s and binary "0" s in said bit stream;
   a phase comparator responsive to said window and clock pulses for generating a phase control signal representing the difference in phase between said window pulse and said clock pulse;
   a frequency comparator responsive to said clock pulse for detecting whether the frequency of said clock pulse is below a lower limit of a predetermined range or above an upper limit thereof and producing a frequency control signal of different levels depending on whether said frequency is below said lower limit or above said upper limit; and
   means for combining said phase control signal and said frequency control signal and applying the combined signals to said voltage-controlled oscillator as said input signal.

2. A clock generator as claimed in claim 1, wherein said frequency comparator includes means for introducing a delay time to said frequency control signal upon the occurrence of same.

3. A clock generator as claimed in claim 1, wherein said frequency comparator comprises:
 detector means for detecting the frequency of said clock pulse at periodic intervals and successively generating a count representing the detected frequency;
 a first comparator for comparing the count with a first reference value representing said lower limit and generating a first voltage when said count is smaller than said first reference value;
 a second comparator for comparing the count with a second reference value representing said upper limit and generating a second voltage when said count is greater than said second reference value; and
 a resistor network coupled to said first and second comparators for combining said first and second voltages to produce said frequency control signal.

4. A clock generator as claimed in claim 3, further comprising:
 a first delay circuit coupled to said first comparator for introducing a delay time to the application of said first voltage to said resistor network; and
 a second delay circuit coupled to said second comparator for introducing a delay time to the application of said second voltage to said resistor network.

5. A clock generator as claimed in claim 4, wherein said first and second delay circuits comprise a first shift register responsive to said first voltage, a second shift register responsive to said second voltage, means for shifting the voltages applied to said first and second shift registers at periodic intervals, a first coincidence gate coupled to said first shift register to generate an output corresponding to said first voltage and a second coincidence gate coupled to said second shift register to generate an output corresponding to said second voltage, the outputs of said first and second coincidence gates being coupled to said resistor network.

6. A clock generator as claimed in claim 1, wherein said combining means comprises an integrator for providing an integrated output to said voltage-controlled oscillator, and wherein said phase comparator comprises means for generating a first pulse having a duration variable as a function of the difference between a predetermined edge of said clock pulse and a leading edge of said window pulse and a second pulse having a duration variable as a function of the difference between said predetermined edge and a trailing edge of said window pulse and applying said first and second pulses to said integrator.

7. A clock generator as claimed in claim 6, wherein said integrator comprises a differential integrator having first and second input terminals, and wherein said phase comparator comprises:
 a coincidence gate responsive to said window and clock pulses for generating a coincidence pulse with a duration representative of the difference in phase between said window and clock pulses;
 a pair of first and second Exclusive-OR gates each having first and second input terminals, the first input terminals of the Exclusive-OR gates being coupled together to be responsive to said coincidence pulse, the second input terminal of said first Exclusive-OR gate being responsive to said window pulse and the second input terminal of said second Exclusive-OR gate being at a predetermined potential; and
 a first voltage dividing resistor network for combining output signals from said first and second Exclusive-OR gates and applying the combined output signals to said first input terminal of the differential integrator,
 further comprising a reference voltage generator which comprises:
 a pair of third and fourth Exclusive-OR gates each having first and second input terminals;
 means for applying predetermined potentials to said first and second input terminals of the third and fourth Exclusive-OR gates so that the third and fourth Exclusive-OR gates generate voltages of opposite polarity; and
 a second voltage dividing resistor network identical in configuration to the first resistor network for combining said opposite polarity voltages and applying, the combined voltages to said second input terminal of the differential integrator.

8. A clock generator as claimed in claim 7, wherein said potential applying means comprises means for applying said bit stream to the first input terminals of said third and fourth Exclusive-OR gates.

9. A clock generator as claimed in claim 7, wherein said potential applying means comprises means for applying said coincidence pulse to the first input terminals of said third and fourth Exclusive-OR gates.

10. A clock generator as claimed in claim 1, wherein said signal combining means comprises an integrator for providing an integrated output to said voltage-controlled oscillator, and wherein said phase comparator comprises means for generating a first pulse having a duration variable as a function of the difference between a predetermined edge of said clock pulse and a predetermined edge of said window pulse when said clock pulse is advanced with respect to said window pulse and a second pulse having a duration variable as a function of the difference between said predetermined edges of said clock and window pulses when said clock pulse lags with respect to said window pulse and applying said first and second pulses to said integrator.

11. A clock generator as claimed in claim 10, wherein said integrator comprises a differential integrator having first and second input terminals, and wherein said phase comparator comprises:
 a pair of first and second D flip-flops;
 means for applying said window and clock pulses to said first and second D flip-flops to generate said first and second pulses at the outputs of the first and second D flip-flops;
 a first voltage dividing resistor network for combining output signals from said first and second D flip-flops and applying the combined output signals to said first input terminal of the differential integrator,
 further comprising a reference voltage generator which comprises:
 a third D flip-flop;
 means for applying predetermined potentials to said third D flip-flop to cause it to generate voltages of opposite polarity; and
 a second voltage dividing resistor network identical in configuration to the first resistor network for combining said opposite polarity voltages and applying the combined voltages to said second input terminal of the differential integrator.

12. A clock generator adatped to receive a digital bit stream, comprising:
- a voltage-controlled oscillator for generating clock pulses having a frequency and a phase which are variable in response to an input signal applied thereto;
- means for generating a window pulse in response to a predetermined transition between binary "1"s and binary "0"s in said bit stream;
- a phase comparator responsive to said window and clock pulses for generating a phase control signal representing the difference in phase between said window pulse and said clock pulse;
- a frequency comparator responsive to said clock pulse for detecting whether the frequency of said clock pulse is below a lower limit of a predetermined range or above an upper limit thereof and producing a frequency control signal of different levels depending on whether said frequency is below said lower limit or above said upper limit; and
- means for combining said phase control signal and said frequency control signal and applying the combined signals to said voltage-controlled oscillator as said input signal, said frequency comparator comprising:
- detector means for detecting the frequency of said clock pulse at periodic intervals and successively generating a count representing the detected frequency;
- a first comparator for comparing the count with a first reference value representing said lower limit and generating a first voltage when said count is smaller than said first reference value;
- a second comparator comparing the count with a second reference value representing said upper limit and generating a second voltage when said count is greater than said second reference value; and
- a resistor network coupled to said first and second comparators for combining said first and second voltages to produce said frequency control signal.

13. A clock generator as claimed in claim 12, further comprising:
- a first delay circuit coupled to said first comparator for introducing a delay time to the application of said first voltage to said resistor network; and
- a second delay circuit coupled to said second comparator for introducing a delay time to the application of said second voltage to said resistor network.

14. A clock generator as claimed in claim 13, wherein said first and second delay circuits comprise a first shift register responsive to said first voltage, a second shift register responsive to said second voltage, means for shifting the voltage applied to said first and second shift registers at periodic intervals, a first coincidence gate coupled to said first shift register to generate an output corresponding to said first voltage and a second coincidence gate coupled to said second shift register to generate an output corresponding to said second voltage, the outputs of said first and second coincidence gates being coupled to said resistor network.

15. A clock generator adapted to receive a digital bit stream, comprising:
- a voltage-controlled oscillator for generating clock pulses having a frequency and a phase which are variable in response to an input signal applied thereto;
- means for generating a window pulse in response to a predetermined transition between binary "1" s and binary "0" s in said bit stream;
- a phase comparator responsive to said window and clock pulses for generating a phase control signal representing the difference in phase between said window pulse and said clock pulse;
- a frequency comparator respnsive to said clock pulse for detecting whether the frequency of said clock pulse is below a lower limit of a predetermined range or above an upper limit thereof and producing a frequency control signal of different levels depending on whether said frequency is below said lower limit or above said upper limit; and
- means for combining said phase control signal and said frequency control signal and applying the combined signal to said voltage-controlled oscillator as said input signal,
- wherein said combining means comprises an integrator for providing an integrated output to said voltage-controlled oscillator, and
- wherein said phase comparator comprises means for generating a first pulse having a duration variable as a function of the difference between a predetermined edge of said clock pulse and a leading edge of said window pulse and a second pulse having a duration variable as a function of the difference between said predetermined edge and a trailing edge of said window pulse and applying said first and second pulses to said integrator.

16. A clock generator as claimed in claim 15, wherein said integrator comprises a differential integrator having first and second input terminals, and wherein said phase comparator comprises:
- a coincindence gate resposnive to said window and clock pulses for generating a coincidence pulse with a duration representative of the difference in phase between said window and clock pulses;
- a pair of first and second Exclusive-OR gates each having first and second input terminals, the first input terminals of the Exclusive-OR gates being coupled together to be responsive to said coincidence pulse, the second input terminal of said first Exclusive-OR gate being responsive to said window pulse and the second input terminal of said second Exclusive-OR gate being at a predetermined potential; and
- a first voltage dividing resistor network for combining output signals from said first and second Exclusive-OR gates and applying the combined output signals to said first input terminal of the differential integrator,
- further comprising a reference voltage generator which comprises:
- a pair of third and fourth Exclusive-OR gates each having first and second input terminals;
- means for applying predetermined potentials to said first and second input terminals of the third and fourth Exclusive-OR gates so that the thrid and fourth Exclusive-OR gates generate voltages of opposite polarity; and
- a second voltage dividing resistor network identical in configuaration to the first resistor network for combining said opposite polarity voltages and applying the combined voltages to said second input terminal of the differential integrator.

17. A clock generator as claimed in claim 16, wherein said potential applying means comprises means for applying said bit stream to the first input terminals of said third and fourth Exclusive-OR gates.

18. A clock generator as claimed in claim 16, wherein said potential applying means comprises means for applying said coincidence pulse to the first input terminals of said third and fourth Exclusive-OR gates.

19. A clock generator adapted to receive a digital bit stream, comprising:
- a voltage-controlled oscillator for generating clock pulses having a frequency and a phase which are variable in response to an input signal applied thereto;
- means for generating a window pulse in response to a predetermined transistion between binary "1" s and binary "0" s in said bit stream;
- a pair of first and second D flip-flops responsive to said window and clock pulses for generating a first and a second pulse;
- a first voltage dividing resistor network for combining said first and second pulses to produce combined pulses;
- a frequency comparator responsive to said clock pulse for detecting whether the frequency of said clock pulse is below a lower limit of a predetermined range or above an upper limit thereof and producing a frequency control signal of different levels depending on whether said frequency is below said lower limit or above said upper limit; and
- a differential integrator having a first input terminal responsive to said combined pulses and a second input terminal;
- a third D flip-flop;
- means for applying predetermined potentials to said third D flip-flop to cause it to generate voltages of opposite polarity; and
- a second voltage dividing resistor network identical in configuration to the first resistor network for combining said opposite polarity voltages and applying the combined voltages to said second input terminal of the differential integrator.

* * * * *